United States Patent
Lee

(10) Patent No.: US 10,846,236 B2
(45) Date of Patent: Nov. 24, 2020

(54) MEMORY DEVICE AND METHOD OF OPERATING THE SAME

(71) Applicant: SK hynix Inc., Icheon-si (KR)

(72) Inventor: Jung Hwan Lee, Suwon-si (KR)

(73) Assignee: SK hynix Inc., Icheon-si (KR)

( * ) Notice: Subject to any disclaimer, the term of this patent is extended or adjusted under 35 U.S.C. 154(b) by 85 days.

(21) Appl. No.: 15/702,935

(22) Filed: Sep. 13, 2017

(65) Prior Publication Data

US 2018/0225220 A1 Aug. 9, 2018

(30) Foreign Application Priority Data

Feb. 7, 2017 (KR) .................. 10-2017-0016825

(51) Int. Cl.
| | | |
|---|---|---|
| *G06F 12/10* | (2016.01) | |
| *G06F 12/1009* | (2016.01) | |
| *G06F 12/0882* | (2016.01) | |
| *G06F 15/78* | (2006.01) | |
| *G11C 16/00* | (2006.01) | |
| *G11C 11/56* | (2006.01) | |
| *G11C 16/04* | (2006.01) | |

(52) U.S. Cl.
CPC ...... *G06F 12/1009* (2013.01); *G06F 12/0882* (2013.01); *G06F 15/785* (2013.01); *G11C 11/5671* (2013.01); *G11C 16/00* (2013.01); *G06F 2212/7201* (2013.01); *G11C 16/0483* (2013.01); *G11C 2211/562* (2013.01); *G11C 2211/5621* (2013.01); *G11C 2211/5625* (2013.01); *G11C 2211/5642* (2013.01); *G11C 2216/14* (2013.01)

(58) Field of Classification Search
CPC .... G06F 12/1009; G06F 9/00; G06F 12/0882; G06F 2212/7201; G11C 16/00
See application file for complete search history.

(56) References Cited

U.S. PATENT DOCUMENTS

| | | | | |
|---|---|---|---|---|
| 2007/0109854 | A1* | 5/2007 | Shibata | G11C 11/5628 365/185.08 |
| 2012/0155168 | A1* | 6/2012 | Kim | G11C 5/14 365/185.03 |
| 2013/0016558 | A1* | 1/2013 | Ahn | G11C 16/0483 365/185.03 |
| 2016/0293259 | A1* | 10/2016 | Kim | G11C 16/08 |

FOREIGN PATENT DOCUMENTS

| | | |
|---|---|---|
| KR | 1020100056860 A | 5/2010 |
| KR | 1020170121618 A | 11/2017 |

* cited by examiner

*Primary Examiner* — Mohammed A Bashar
(74) *Attorney, Agent, or Firm* — William Park & Associates Ltd.

(57) ABSTRACT

A memory device and a method of operating the same. The memory device may include a memory block including a plurality of pages, and a control logic configured to include at least one register in which a plurality of program algorithms and a plurality of pieces of operation information are stored, select any one of the program algorithms in response to an address of a program target page, among the pages, and perform a program operation on the program target page based on the selected program algorithm and operation information corresponding to the selected program algorithm.

18 Claims, 13 Drawing Sheets

MEMORY DEVICE AND METHOD OF OPERATING THE SAME

CROSS-REFERENCE TO RELATED APPLICATION

The present application claims priority under 35 U.S.C. § 119(a) to Korean patent application number 10-2017-0016825 filed on Feb. 7, 2017 in the Korean Intellectual Property Office, which is incorporated herein by reference in its entirety, as though fully set forth herein.

BACKGROUND

The present invention relates generally to a memory device and a method of operating the memory device, and more particularly, to a method of performing a program operation of a memory device.

Memory devices may be classified as volatile memory devices or nonvolatile memory devices.

A nonvolatile memory device can retain its contents even when the power supply is interrupted. Although read and write speeds of a nonvolatile memory device are relatively low compared to those of the volatile memory device, the nonvolatile memory device is widely used for portable electronic devices, because the nonvolatile memory device retains its contents regardless of whether it is connected to a power supply.

Examples of the nonvolatile memory device may include a read-only memory (ROM), a mask ROM (MROM), a programmable ROM (PROM), an erasable programmable ROM (EPROM), an electrically erasable programmable ROM (EEPROM), a flash memory, a phase-change random access memory (PRAM), a magnetic RAM (MRAM), a resistive RAM (RRAM), and a ferroelectric RAM (FRAM) according to the data storage scheme.

The flash memory may have a two-dimensional (2D) structure in which cell strings are horizontally arranged on a semiconductor substrate. Alternatively, the flash memory may have a three-dimensional (3D) structure in which cell strings are vertically arranged on a semiconductor substrate. As the two-dimensional (2D) structure is reaching its physical scaling limit, semiconductor manufacturers are producing memory devices that include memory cells vertically stacked on a semiconductor substrate.

SUMMARY

In an embodiment in accordance with the present invention, a memory device may include a memory block including a plurality of pages, and a control logic configured to include a register in which a plurality of program algorithms and a plurality of pieces of operation information are stored, select any one of the program algorithms in response to an address of a program target page, among the pages, and perform a program operation on the program target page based on the selected program algorithm and operation information corresponding to the selected program algorithm.

In an embodiment, a method of operating a memory device may include storing program algorithms having different voltage conditions in a register, allowing pieces of operation information related to different verify operations to correspond to the respective program algorithms, selecting any one of the program algorithms in response to an address of a program target page, among a plurality of pages, and performing a program operation on the program target page based on the selected program algorithm and operation information corresponding to the selected program algorithm.

BRIEF DESCRIPTION OF THE DRAWINGS

The above and other features and advantages of the present invention will become readily apparent by reference to the following detailed description when considered in conjunction with the accompanying drawings wherein.

DETAILED DESCRIPTION

Figure 1:
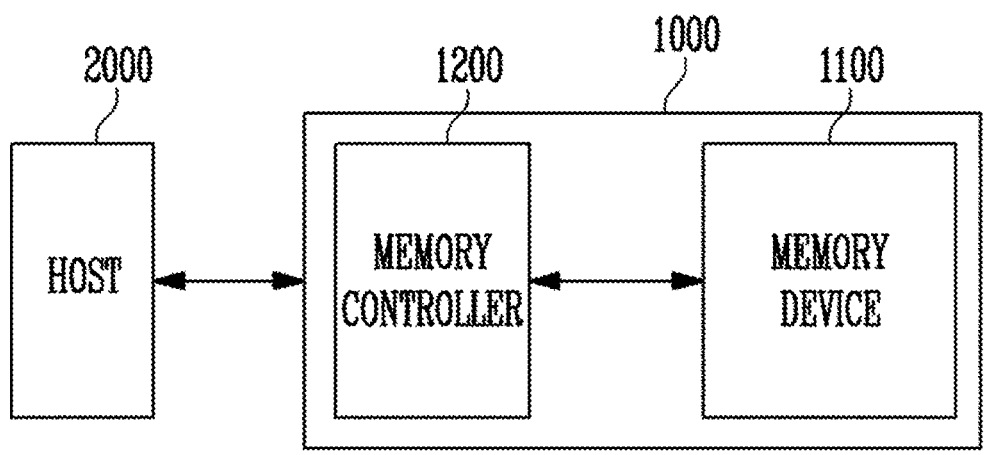
FIG. 1 is a diagram illustrating a memory system in an embodiment in accordance with the present invention.

Hereinafter, embodiments in accordance with the present invention will be explained in more detail with reference to the accompanying drawings. Although the present invention is described with reference to a number of example embodiments thereof, it should be understood that numerous other modifications and variations may be devised by one skilled in the art that will fall within the spirit and scope of the invention.

In the drawing figures, dimensions may be exaggerated for clarity of illustration. It will be understood that when an element is referred to as being "between" two elements, it can be the only element between the two elements, or one or more intervening elements may also be present.

Embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as "first" and "second" may be used to describe various components, but they should not limit the various components. Those terms are only used for the purpose of differentiating a component from other components. For example, a first component may be referred to as a second component, and a second component may be referred to as a first component and so forth without departing from the spirit and scope of the present invention. "And/or" may include any one of or a combination of the components mentioned.

A singular form may include a plural from as long as it is not specifically mentioned in a sentence. "Include/comprise" or "including/comprising" used in the specification represents that one or more components, steps, operations, and elements exist or are added.

Unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

FIG. 1 is a diagram illustrating a memory system in an embodiment in accordance with the present invention.

Referring to FIG. 1, a memory system 1000 may include a memory device 1100 for storing data and a memory controller 1200 for controlling the memory device 1100 under the control of a host 2000.

The host 2000 may communicate with the memory system 1000 using an interface protocol such as a peripheral component interconnect-express (PCI-E), an advanced technology attachment (ATA), a serial ATA (SATA), a parallel ATA (PATA) or a serial attached SCSI (SAS). In addition, the interface protocol provided for the purpose of data communication between the host 2000 and the memory system 1000 is not limited to the above examples and may be an interface protocol such as a Universal Serial Bus (USB), a Multi-Media Card (MMC), an Enhanced Small Disk Interface (ESDI), or Integrated Drive Electronics (IDE).

The memory controller 1200 may control overall operation of the memory system 1000 and may control data exchange between the host 2000 and the memory device 1100. For example, the memory controller 1200 may program or read data by controlling the memory device 1100 in response to a request from the host 2000. Further, the memory controller 1200 may store information of main memory blocks and sub-memory blocks included in the memory device 1100, and may select the memory device 1100 so that a program operation is performed on a main memory block or a sub-memory block depending on the amount of data that is loaded for the program operation. In an embodiment, the memory device 1110 may include a double data rate synchronous dynamic random access memory (DDR SDRAM), a low power DDR SDRAM fourth generation (LPDDR4 SDRAM), a graphics double data rate SDRAM (GDDR SDRAM), a low power DDR (LPDDR), a Rambus dynamic random access memory (RDRAM) or a flash memory.

The memory device 1100 may perform a program operation, a read operation or an erase operation under the control of the memory controller 1200.

Figure 2:
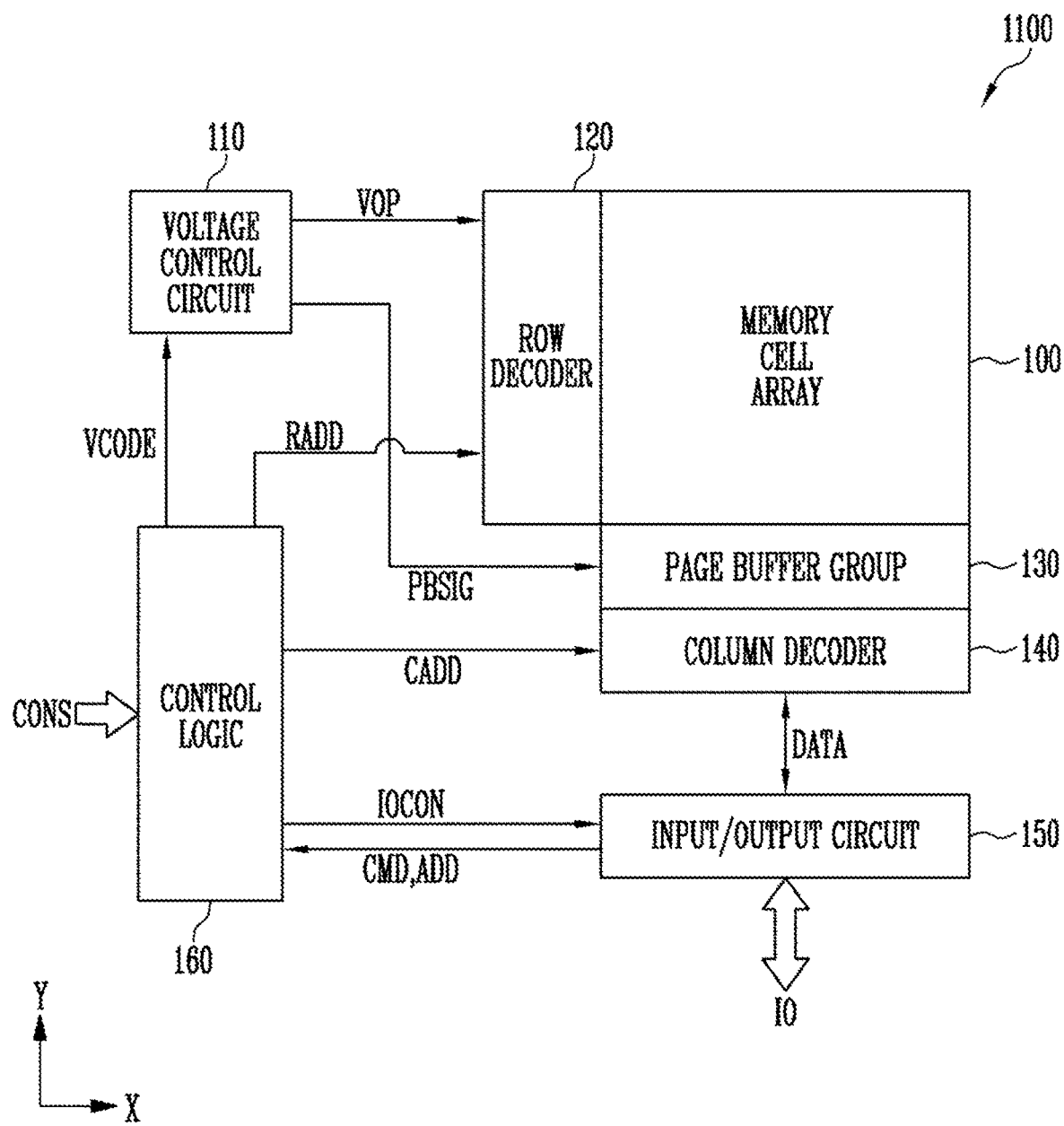
FIG. 2 is a diagram illustrating a memory device of FIG. 1.

FIG. 2 is a diagram illustrating the memory device of FIG. 1.

Referring to FIG. 2, the memory device 1100 may include a memory cell array 100 that stores data therein, peripheral circuits 110 to 150 that are capable of performing program, read, and erase operations, and a control logic 160 that is capable of controlling the peripheral circuits 110 to 150.

The memory cell array 100 may include a plurality of memory blocks in which data is stored. Each of the memory blocks may include a plurality of strings implemented in a two-dimensional (2D) or a three-dimensional (3D) structure. Each of the strings may include a plurality of memory cells.

The peripheral circuits 110 to 150 may include a voltage control circuit 110, a row decoder 120, a page buffer group 130, a column decoder 140, and an input/output circuit 150.

The voltage control circuit 110 may output various operation voltages VOP and page buffer control signals PBSIG required for the program, read or erase operation in response to a voltage control code VCODE. The page buffer control signals PBSIG may be output as high or low signals. In this case, the voltage control circuit 110 may output the page buffer control signals PBSIG by controlling the voltage levels thereof.

The row decoder 120 may transfer the operation voltages VOP to the memory cell array 100 in response to a row address RADD. For example, the row decoder 120 may transfer the operation voltages VOP to a memory block selected from among the memory blocks included in the memory cell array 100 in response to the row address RADD.

The page buffer group 130 may temporarily store data or may sense data in response to the page buffer control signals PBSIG. For example, the page buffer group 130 may sense data of the memory cells depending on the voltage or current received from the memory cell array 100. For this operation, the page buffer group 130 may include a plurality of page buffers for sensing voltages or currents from the strings included in the memory cell array 100.

The column decoder 140 may transfer data DATA, received from the outside of the memory device, to the page buffer group 130 or may output data DATA, received from the page buffer group 130, in response to a column address CADD.

The input/output circuit 150 may transmit and receive data between an external device and the memory device 1100 through input/output lines IO in response to input/output control signals IOCON. Here, the external device may be a memory controller (e.g., 1200 of FIG. 1). Further, the input/output circuit 150 may transfer a command CMD and an address ADD, received from the external device, to the control logic 160 in response to the input/output control signals IOCON.

The control logic 160 may control the overall operation of the memory device 1100 in response to control signals CONS, the command CMD, and the address ADD. For example, the control signals CONS may include a chip enable signal, a command latch enable signal, an address latch enable signal, a write enable signal, a ready busy signal, etc., which are required to control the overall operation of the memory device 1100.

Further, the control logic 160 may include registers in which various types of information are stored. For example, in the registers, various algorithms and various types of operation information related to a program, read or erase operation may be stored. In detail, in the registers, codes for algorithms and codes for the operation information may be stored.

When the program operation is described by way of example, the program operation may be performed using an incremental step pulse program (ISPP) method that increases a program voltage by a step voltage as the number of program loops increases. In a program operation in which a step voltage is high, the threshold voltages of memory cells may increase rapidly. In a program operation in which a step voltage is low, the threshold voltages of memory cells may increase slowly. In the registers, different program algorithms may be stored depending on the difference between step voltages. Here, the program algorithms may be stored in the form of codes in the registers. That is, in the registers, codes for various program algorithms may be stored.

The operation information may include information about periods in which verify operations are omitted in the program operation, or information about points in time at which verify operations start. For example, in a multi-level cell scheme in which two or more bits of data are stored in a single memory cell, a plurality of verify operations may be performed depending on a plurality of target voltages. However, at the beginning of the program operation, the threshold voltages of the memory cells cannot rapidly reach the target voltages, and thus periods in which some verify operations are omitted or the points in time at which verify operations start may be adjusted in order to shorten the operation time.

In particular, the operation information may be stored in the registers so that pieces of operation information correspond to respective program algorithms. For example, when one of the program algorithms is selected, the operation information corresponding to the selected program algorithm may be automatically selected. Therefore, when the program operation is performed based on the selected program algorithm, the program operation may vary depending on the operation information corresponding to the selected algorithm.

Figure 3:
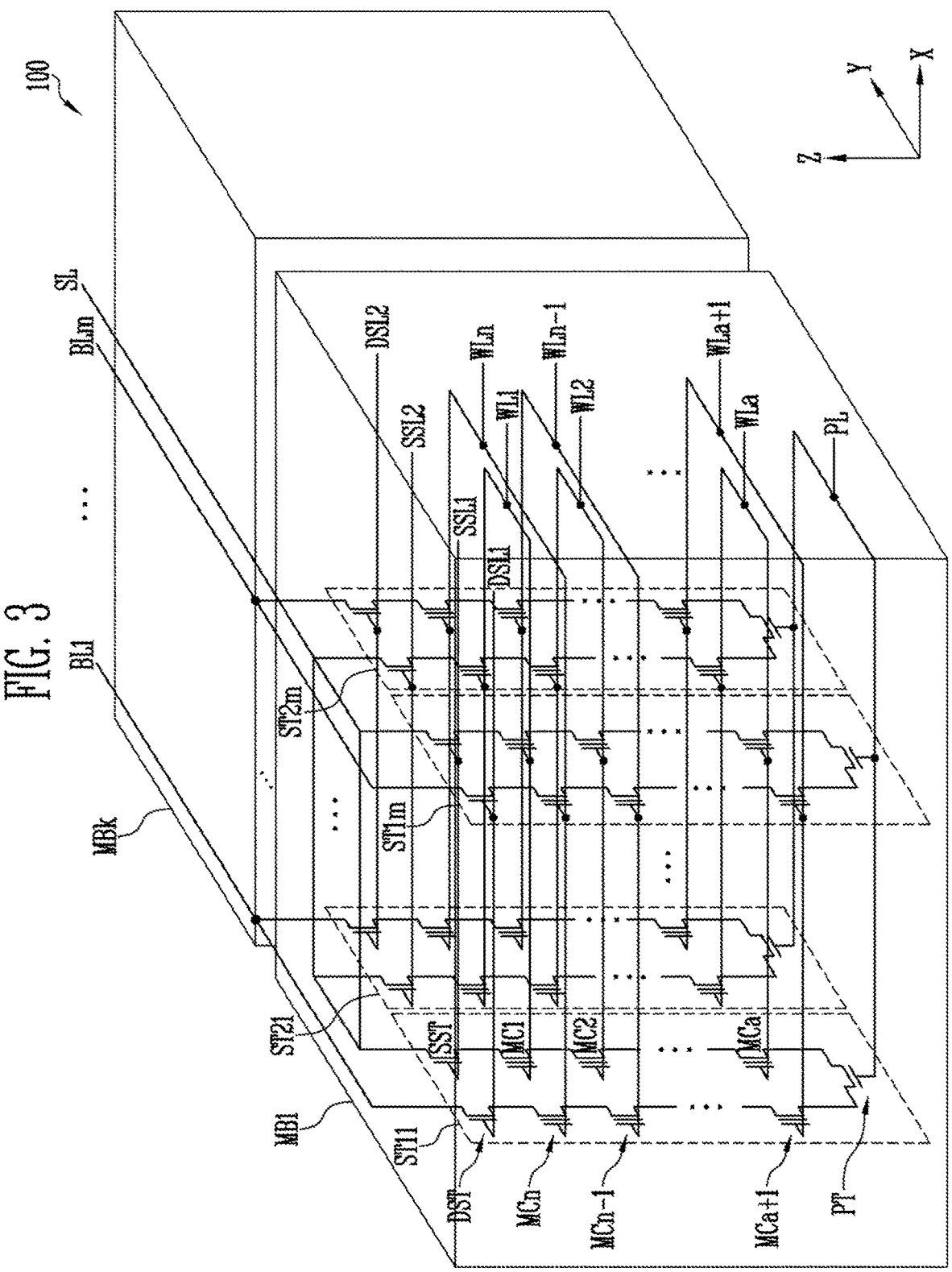
FIG. 3 is a diagram illustrating an embodiment of a memory block implemented in a 3D structure.

FIG. 3 is a diagram illustrating an embodiment of a memory block implemented in a 3D structure.

Referring to FIG. 3, a memory cell array (e.g., 100 of FIG. 2) may include a plurality of memory blocks MB1 to MBk. The internal configuration of the first memory block MB1 is illustrated in FIG. 3 to help in understanding the various embodiments in accordance with the present invention, and the internal configuration of the remaining memory blocks MB2 to MBk is omitted. The second to k-th memory blocks MB2 to MBk may have the same configuration as the first memory block MB1.

The first memory block MB1 may include a plurality of strings ST11 to ST1$m$ and ST21 to ST2$m$. In an embodiment, each of the strings ST11 to ST1$m$ and ST21 to ST2$m$ may be formed in a 'U' shape. In the first memory block MB1, m strings may be arranged in a row direction (an X direction). In FIG. 3, two strings are illustrated as being arranged in a column direction (a Y direction). However, this illustration is made for the convenience of description, and three or more strings may be arranged in the column direction (the Y direction).

Each of the plurality of strings ST11 to ST1$m$ and ST21 to ST2$m$ may include at least one source select transistor SST, first to n-th memory cells MC1 to MCn, a pipe transistor PT, and at least one drain select transistor DST.

The source and drain select transistors SST and DST and the memory cells MC1 to MCn may have similar structures. In an embodiment, each of the source and drain select transistors SST and DST and the memory cells MC1 to MCn may include a channel layer, a tunnel insulating layer, a charge trap layer, and a blocking insulating layer. For example, a pillar for providing the channel layer may be provided to each string. In an embodiment, a pillar for providing at least one of the channel layer, the tunnel insulating layer, the charge trap layer, and the blocking insulating layer may be provided to each string.

The source select transistor SST of each string may be coupled between a source line SL and memory cells MC1 to MCa. In an embodiment, the source select transistors of strings arranged in the same row may be coupled to a source select line extended in a row direction, and source select transistors of strings arranged in different rows may be coupled to different source select lines. In FIG. 3, the source select transistors of the strings ST11 to ST1$m$ in a first row may be coupled to a first source select line SSL1. The source select transistors of the strings ST21 to ST2$m$ in a second row may be coupled to a second source select line SSL2.

In another embodiment, the source select transistors of the strings ST11 to ST1$m$ and ST21 to ST2$m$ may be coupled in common to a single source select line.

The first to n-th memory cells MC1 to MCn in each string may be coupled between the source select transistor SST and the drain select transistor DST.

The first to n-th memory cells MC1 to MCn may be divided into first to a-th memory cells MC1 to MCa and a+1-th to n-th memory cells MCa+1 to MCn. The first to a-th memory cells MC1 to MCa may be sequentially arranged in a vertical direction (a Z direction) and may be connected in series between the source select transistor SST and the pipe transistor PT. The a+1-th to n-th memory cells MCa+1 to MCn may be sequentially arranged in the vertical direction (the Z direction) and may be connected in series between the pipe transistor PT and the drain select transistor DST. The first to a-th memory cells MC1 to MCa and the a+1-th to n-th memory cells MCa+1 to MCn may be coupled to each other through the pipe transistor PT. The gates of the first to n-th memory cells MC1 to MCn of each string may be coupled to first to n-th word lines WL1 to WLn, respectively.

In an embodiment, at least one of the first to n-th memory cells MC1 to MCn may be used as a dummy memory cell. When the dummy memory cell is provided, the voltage or current of the corresponding string may be stably controlled. A gate of the pipe transistor PT of each string may be coupled to a pipeline PL.

The drain select transistor DST of each string may be coupled between the corresponding bit line and the memory cells MCa+1 to MCn. The strings arranged in a row direction may be coupled to drain select lines extended in the row direction. The drain select transistors of the strings ST11 to ST1$m$ in a first row may be coupled to a first drain select line DSL1. The drain select transistors of the strings ST21 to ST2$m$ in a second row may be coupled to a second drain select line DSL2.

The strings arranged in a column direction may be coupled to bit lines extended in the column direction. In FIG. 3, the strings ST11 and ST21 in a first column may be coupled to a first bit line BL1. The strings ST1$m$ and ST2$m$ in an m-th column may be coupled to an m-th bit line BL$m$.

Memory cells coupled to the same word line, among strings arranged in a row direction, constitute a single page.

For example, memory cells coupled to the first word line WL1, among the strings ST11 to ST1m in the first row, may constitute a single page. Memory cells coupled to the first word line WL1, among the strings ST21 to ST2m in the second row, may constitute a single additional page. The strings arranged in the direction of a single row may be selected by selecting any one of the drain select lines DSL1 and DSL2. A single page may be selected from the selected strings by selecting any one of the word lines WL1 to WLn. The program operation may be performed on a page basis.

Figure 4:
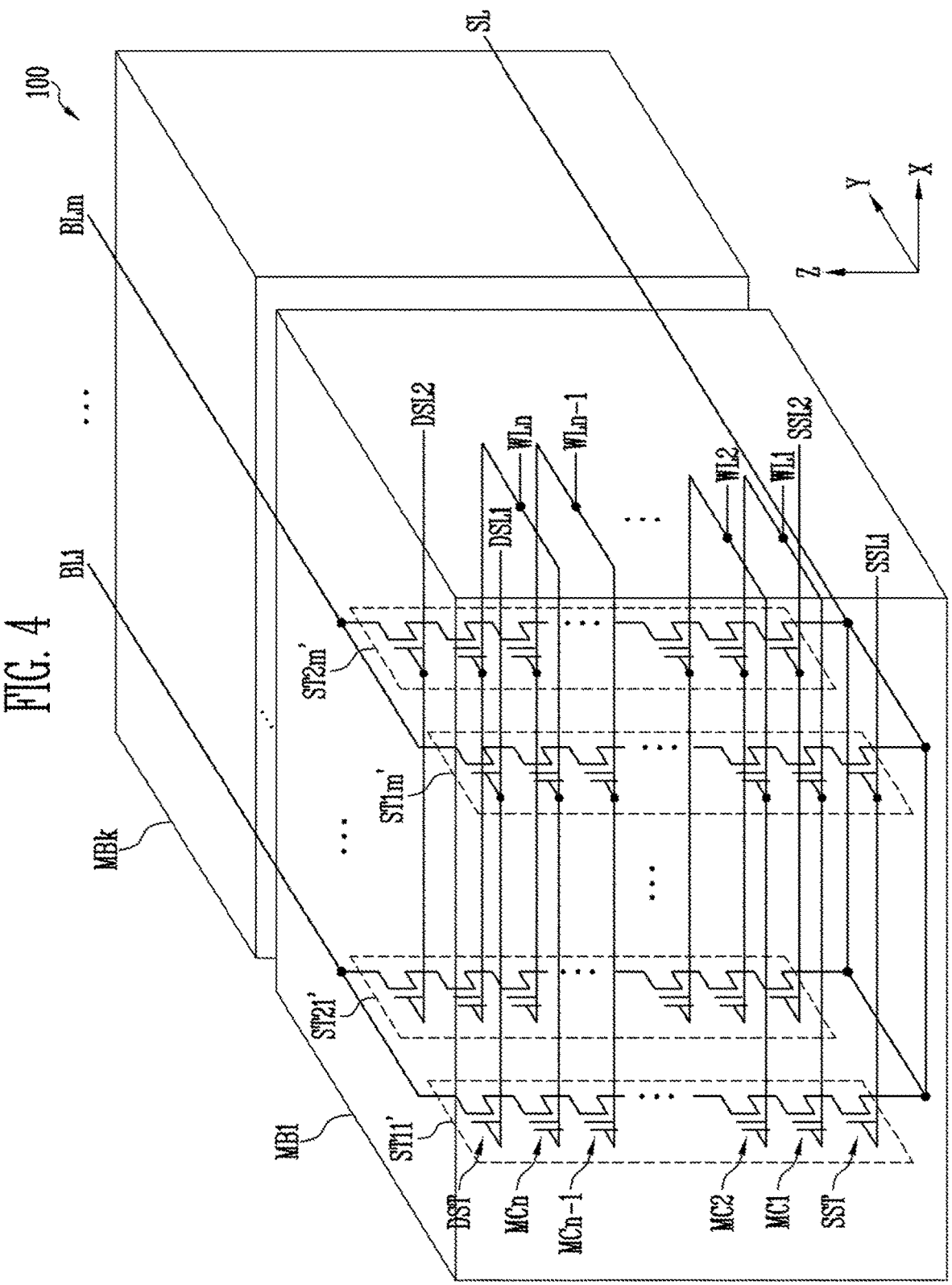
FIG. 4 is a diagram illustrating another embodiment of a memory block implemented in a 3D structure.

FIG. 4 is a diagram illustrating an embodiment of a memory block implemented in a 3D structure.

Referring to FIG. 4, a memory cell array (e.g., 100 of FIG. 2) may include a plurality of memory blocks MB1 to MBk. The internal configuration of the first memory block MB1 is illustrated in FIG. 4 to help in understanding the various embodiments in accordance with the present invention, and the internal configuration of the remaining memory blocks MB2 to MBk is omitted. The second to k-th memory blocks MB2 to MBk may have the same configuration as the first memory block MB1.

The first memory block MB1 may include a plurality of strings ST11' to ST1m' and ST21' to ST2m'. Each of the strings ST11' to ST1m' and ST21' to ST2m' may be extended in a vertical direction (a Z direction). In the first memory block MB1, m strings may be arranged in a row direction (an X direction). Although two strings are illustrated as being arranged in a column direction (a Y direction) in FIG. 4, this illustration is merely made for the convenience of description, and three or more strings may be arranged in the column direction (the Y direction).

Each of the strings ST11' to ST1m' and ST21' to ST2m' may include at least one source select transistor SST, first to n-th memory cells MC1 to MCn, and at least one drain select transistor DST.

The source select transistor SST of each string may be coupled between a source line SL and the memory cells MC1 to MCn. The source select transistors of strings arranged in the same row may be coupled to the same source select line. The source select transistors of the strings ST11' to ST1m' arranged in a first row may be coupled to a first source select line SSL1. The source select transistors of the strings ST21' to ST2m' arranged in a second row may be coupled to a second source select line SSL2. In other embodiments, the source select transistors of the strings ST11' to ST1m' and ST21' to ST2m' may be coupled in common to a single source select line.

The first to n-th memory cells MC1 to MCn in each string may be connected in series between the source select transistor SST and the drain select transistor DST. The gates of the first to n-th memory cells MC1 to MCn may be coupled to first to n-th word lines WL1 to WLn, respectively.

In an embodiment, at least one of the first to n-th memory cells MC1 to MCn may be used as a dummy memory cell. When the dummy memory cell is provided, the voltage or current of the corresponding string may be stably controlled. Accordingly, the reliability of data stored in the memory block MB1 may be improved.

The drain select transistor DST of each string may be coupled between the corresponding bit line and the memory cells MC1 to MCn. The drain select transistors DST of strings arranged in a row direction may be coupled to drain select lines extended in the row direction. The drain select transistors DST of the strings ST11' to ST1m' in a first row may be coupled to a first drain select line DSL1. The drain select transistors DST of the strings ST21' to ST2m' in a second row may be coupled to a second drain select line DSL2.

Among the strings arranged in the row direction, memory cells coupled to the same word line may constitute a single page. For example, among the strings ST11' to ST1m' in a first row, memory cells coupled to the first word line WL1 may constitute a single page. The program operation may be performed on a page basis.

The memory block MB1 of FIG. 4 may have an equivalent circuit similar to that of the memory block MB1 of FIG. 3 except that a pipe transistor PT is emitted from each string.

Figure 5:
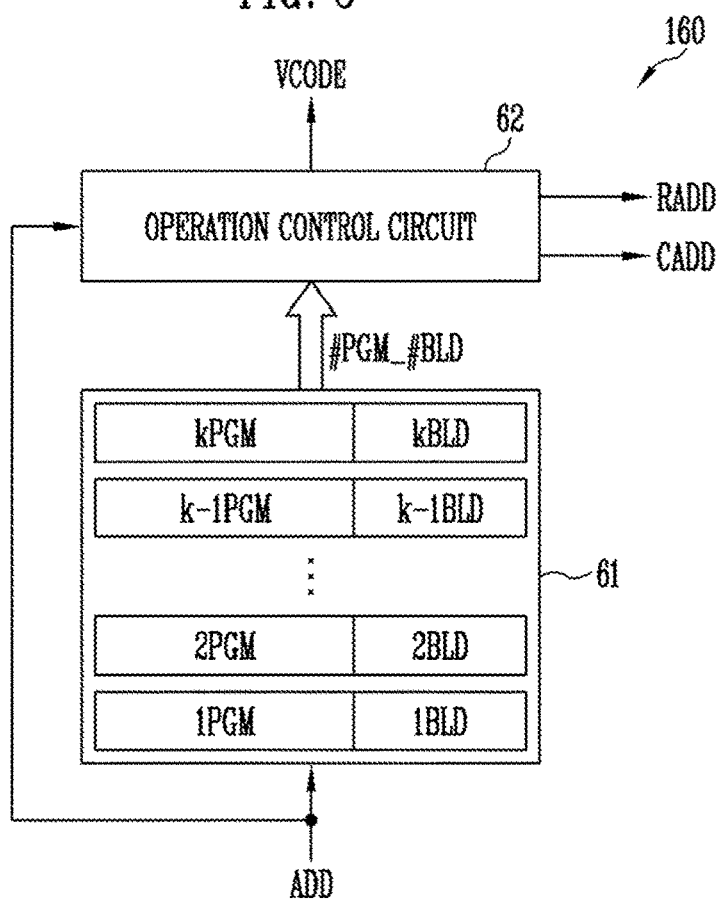
FIG. 5 is a diagram illustrating an embodiment of the control logic of FIG. 2.

FIG. 5 is a diagram illustrating an embodiment of the control logic of FIG. 2.

Referring to FIG. 5, a part of the control logic 160 is illustrated. The control logic 160 may include a register 61 and an operation control circuit 62.

In the register 61, codes for various algorithms related to a program, read or erase operation and codes for pieces of operation information may be stored. For example, in the register 61, codes for various program algorithms 1PGM to kPGM (where k is a positive integer) and codes for pieces of operation information 1BLD to kBLD (where k is a positive integer) may be stored. The program algorithms 1PGM to kPGM and the pieces of operation information 1BLD to kBLD may make respective pairs. Therefore, when a selected program algorithm (i.e., any one of 1PGM to kPGM) is performed, a program operation may be adjusted depending on the operation information (i.e., any one of 1BLD to kBLD) making a pair with the selected program algorithm. For example, when codes for the first to k-th program algorithms 1PGM to kPGM and codes for the first to k-th pieces of operation information 1BLD to kBLD are stored in the register 61, the first operation information 1BLD may be automatically selected when the first program algorithm 1PGM is selected, and the k-th operation information kBLD may be automatically selected when the k-th program algorithm kPGM is selected.

The first to k-th program algorithms 1PGM to kPGM are performed based on an incremental step pulse program (ISPP) method that increases a program voltage by a step voltage as the number of program loops increases, but such a step voltage may be set to different voltages. For example, the first program algorithm 1PGM may be set such that the program voltage is increased by a first step voltage, the second program algorithm 2PGM may be set such that the program voltage is increased by a second step voltage different from the first step voltage, and the k-th program algorithm kPGM may be set such that the program voltage is increased by a k-th step voltage.

The first to k-th pieces of operation information 1BLD to kBLD may include information about a period in which a verify operation is omitted, or information about a point in time at which the verify operation starts. For example, in the ISPP method-based program operation, a plurality of program loops may be executed. Here, one program loop may include a sub-program operation and a verify operation. The sub-program operation denotes an operation of applying a program voltage to a selected word line and then increasing the threshold voltages of selected memory cells. The verify operation denotes an operation of applying a verify voltage to the selected word line and then determining whether the threshold voltages of the selected memory cells have reached target voltages.

In a multi-level cell scheme in which two or more bits of data are stored in a single memory cell, a plurality of target voltages may be set, and thus a plurality of verify operations may be performed in one program loop. However, when the program voltage is low, it is difficult for the threshold voltages of memory cells to increase up to the target voltages, and thus some verify operations may be omitted in some periods in order to shorten the time required for the program operation. In this way, the periods in which some verify operations are omitted may be referred to as "blind periods". The above-described first to k-th pieces of operation information 1BLD to kBLD may include such blind information. For example, the operation information may include information about periods in which verify operations are omitted or information about points in time at which the verify operations start. When information about each period in which verify operations are omitted is stored, some verify operations may be omitted until the corresponding period has elapsed, and the omitted verify operations may be performed from a point in the time at which the corresponding period is terminated. Alternatively, when the information about each of the points in time at which verify operations start is stored, some verify operations may be omitted until the point in time, and the omitted verify operations may be performed after the corresponding point in time. Here, the periods in which verify operations are omitted or the points in time at which verify operations start may be set based on the number of program loops or the number of applications of program voltages.

During the program operation, the register 61 may output a code for a program algorithm, selected from among the first to k-th program algorithms 1PGM to kPGM, and for operation information corresponding to the selected program algorithm as a program operation code #PGM_#BLD (where # is one of 1 to k) in response to an address ADD. For example, the register 61 may output any one of the first to k-th program operation codes 1PGM_1BLD to kPGM_kBLD in response to a row address included in the address ADD. For example, the register 61 may output the k-th program operation code kPGM_kBLD in response to the row address included in the address ADD.

The operation control circuit 62 may output a voltage control code VCODE, a row address RADD, and a column address CADD so that the program operation may be performed in response to the received program operation code #PGM_#BLD.

As described above, when operation information corresponds to a program algorithm and is automatically applied to the program operation based on a selected program algorithm, there is no need to store pieces of operation information for respective pages, and thus the capacity of the register 61 to be used may be reduced.

Figure 6:
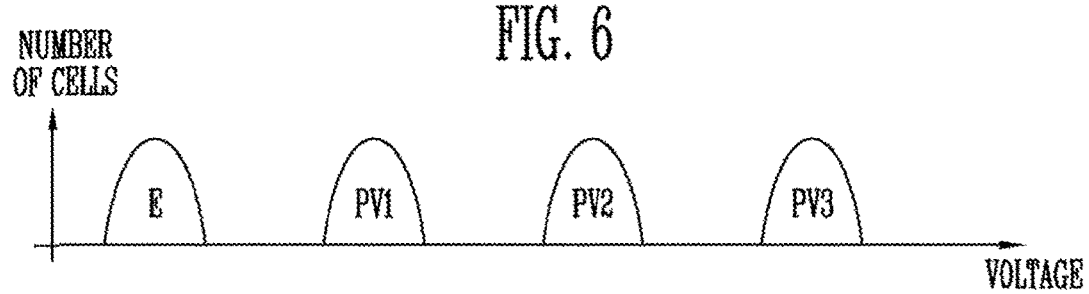
FIG. 6 is a diagram illustrating the threshold voltage distribution of a multi-level cell.

FIG. 6 is a diagram illustrating the threshold voltage distribution of a multi-level cell.

Referring to FIG. 6, in a multi-level cell, the states of memory cells may be classified into four states depending on the threshold voltage distribution. For example, the states of memory cells may be classified into one erase state E and three program states PV1 to PV3 depending on the threshold voltage distribution. For example, the program states PV1 to PV3 may be divided into the first program state PV1 in which the threshold voltage is higher than that in the erase state E, the second program state PV2 in which the threshold voltage is higher than that in the first program state PV1, and the third program state PV3 in which the threshold voltage is higher than that in the second program state PV2.

During the program operation, selected memory cells included in the selected page may be maintained in the erase state E or may be programmed to any one of the first to third program states PV1 to PV3. Therefore, in any one program loop, one sub-program operation and one or more verify operations may be performed. For example, when memory cells to be programmed to first, second, and third target voltages are included in the selected page, the first to third verify operations may be performed in the program loop. Here, a step voltage may be set based on the above-described program algorithm, and some of the first to third verify operations may be omitted from some program loops depending on the above-described operation information. For example, at the beginning of the program operation, the second and third verify operations may be omitted depending on blind information, and the second and third verify operations may be sequentially performed after the blind periods.

Figure 7:
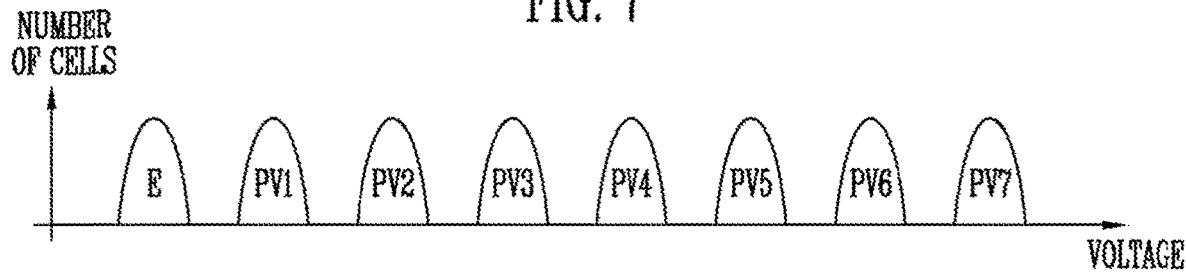
FIG. 7 is a diagram illustrating the threshold voltage distribution of a triple-level cell.

FIG. 7 is a diagram illustrating the threshold voltage distribution of a triple-level cell.

Referring to FIG. 7, the states of memory cells in a triple-level cell may be classified into eight states depending on the threshold voltage distribution. For example, the states of memory cells may be classified into one erase state E and seven program states PV1 to PV7 depending on the threshold voltage distribution. For example, the program states PV1 to PV7 may be divided into the first program state PV1 in which the threshold voltage is higher than that in the erase state E, the second program state PV2 in which the threshold voltage is higher than that in the first program state PV1, the third program state PV3 in which the threshold voltage is higher than that in the second program state PV2, the fourth program state PV4 in which the threshold voltage is higher than that in the third program state PV3, the fifth program state PV5 in which the threshold voltage is higher than that in the fourth program state PV4, the sixth program state PV6 in which the threshold voltage is higher than that in the fifth program state PV5, and the seventh program state PV7 in which the threshold voltage is higher than that in the sixth program state PV6.

During the program operation, selected memory cells included in the selected page may be maintained in the erase state E or may be programmed to any one of the first to seventh program states PV1 to PV7. Therefore, in one program loop, one sub-program operation and one or more verify operations may be performed. For example, when memory cells to be programmed to the first to seventh target voltages are included in the selected page, first to seventh verify operations may be performed in the program loop. Here, a step voltage may be set based on the above-described program algorithm, and some of the first to seventh verify operations may be selectively omitted from some program loops depending on the above-described operation information.

In the above-described embodiments, the program operation of the multi-level cell will be described by way of example.

Figure 8:
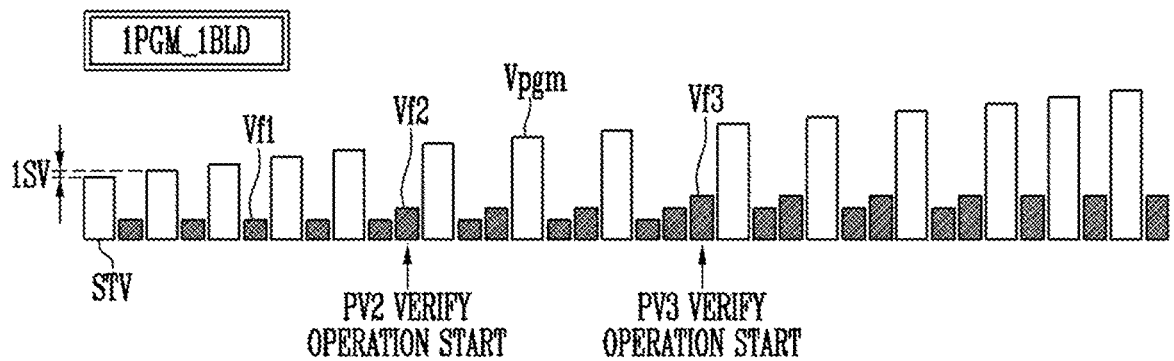
FIGS. 8 to 10 are diagrams that aid in explaining program operation depending on program operation codes.
Figure 9:
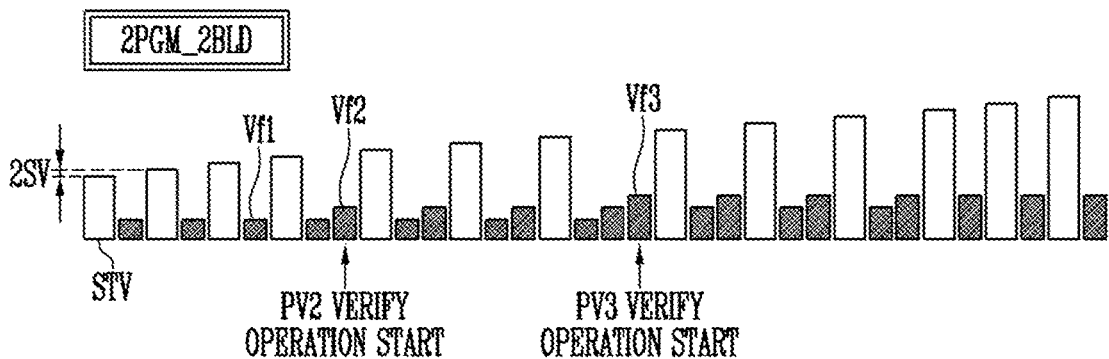
Figure 10:
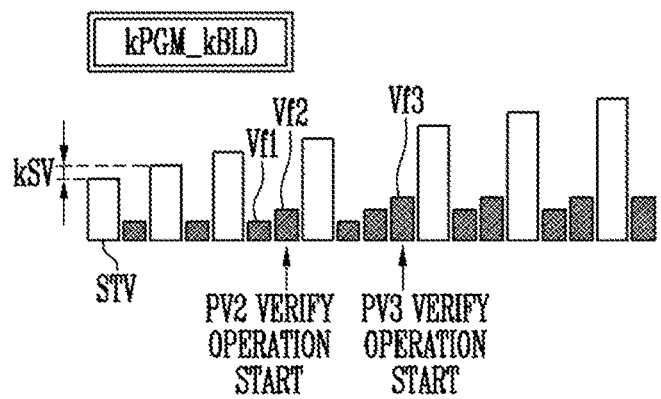

FIGS. 8 to 10 are diagrams for explaining examples of a program operation depending on the program operation code, wherein a program operation based on a multi-level cell scheme will be described by way of example.

FIG. 8 is a diagram for explaining an example of a program operation depending on a first program operation code 1PGM_1BLD, FIG. 9 is a diagram for explaining an example of a program operation depending on a second program operation code 2PGM_2BLD, and FIG. 10 is a diagram for explaining an example of a program operation depending on a k-th program operation code kPGM_kBLD.

Referring to FIG. 8, the first program operation code 1PGM_1BLD may include codes for a first program algorithm 1PGM and first operation information 1BLD. A program operation of increasing a program voltage Vpgm by a first step voltage 1SV may be performed based on the first program algorithm 1PGM.

During the program operation, depending on the first operation information 1BLD, a first verify operation that uses only a first verify voltage Vf1 may be performed up to program loops in which a start program voltage STV to a fourth program voltage Vpgm are used, a second verify operation that uses a second verify voltage Vf2 may be additionally performed from a program loop in which a fifth program voltage Vpgm is used, and a third verify operation that uses a third verify voltage Vf3 may be additionally performed from a program loop in which an eighth program voltage Vpgm is used. That is, a period from the first to fourth program loops may become a blind period in which second and third verify operations are omitted, and a period from the fifth to seventh program loops may become a blind period in which the third verify operation is omitted.

Since FIG. 8 is the diagram for explaining an example of a program operation depending on the first program operation code 1PGM_1BLD, the level of the first step voltage 1SV and blind periods may be set differently depending on the memory device.

Referring to FIG. 9, the second program operation code 2PGM_2BLD may include codes for a second program algorithm 2PGM and second operation information 2BLD. A program operation of increasing a program voltage Vpgm by a second step voltage 2SV, which is different from the first step voltage 1SV, may be performed based on the second program algorithm 2PGM. For example, the second step voltage 2SV may be set to a voltage higher than the first step voltage 1SV.

During the program operation, depending on the second operation information 2BLD, a first verify operation that uses only a first verify voltage Vf1 may be performed up to program loops in which a start program voltage SW to a third program voltage Vpgm are used, a second verify operation that uses a second verify voltage Vf2 may be additionally performed from a program loop in which a fourth program voltage Vpgm is used, and a third verify operation that uses a third verify voltage Vf3 may be additionally performed from a program loop in which a seventh program voltage Vpgm is used. That is, a period from the first to third program loops may become a blind period in which second and third verify operations are omitted, and a period from the fourth to sixth program loops may become a blind period in which the third verify operation is omitted.

Since FIG. 9 is the diagram for explaining an example of a program operation depending on the second program operation code 2PGM_2BLD, the level of the second step voltage 2SV and blind periods may be set differently depending on the memory device.

Referring to FIG. 10, the k-th program operation code kPGM_kBLD may include codes for a k-th program algorithm kPGM and k-th operation information kBLD. A program operation of increasing a program voltage Vpgm by a k-th step voltage kSV may be performed based on the k-th program algorithm kPGM.

During the program operation, depending on the k-th operation information kBLD, a first verify operation that uses only a first verify voltage Vf1 may be performed up to program loops in which a start program voltage STV to a second program voltage Vpgm are used, a second verify operation that uses a second verify voltage Vf2 may be additionally performed from a program loop in which a third program voltage Vpgm is used, and a third verify operation that uses a third verify voltage Vf3 may be additionally performed from a program loop in which a fourth program voltage Vpgm is used. That is, a period from the first to second program loops may become a blind period in which second and third verify operations are omitted, and a period corresponding to the third program loop may become a blind period in which the third verify operation is omitted.

Since FIG. 10 is the diagram for explaining an example of a program operation based on the k-th program operation code kPGM_kBLD, the level of the k-th step voltage kSV and blind periods may be set differently depending on the memory device.

In the above-described FIGS. 8 to 10, although program operations in which step voltages and blind periods are set differently depending on different program operation codes #PGM_#BLD have been described, various conditions related to program operations (e.g., a start program voltage, voltage application times, etc.) may also be differently set in addition to the set program operations. Such program operation conditions may be automatically selected based on a program algorithm selected by the address, and may then be applied to the program operations.

A program algorithm may be selected differently depending on the page selected from among a plurality of pages included in the same memory block. For example, different program algorithms may be selected for respective pages. In this case, operation information corresponding to each selected algorithm may be automatically applied and then the corresponding program operation may be performed. Alternatively, word lines coupled to a memory block may be grouped, and different program algorithms may be applied to respective groups.

Among these examples, an example in which word lines are grouped will be described below.

Figure 11:
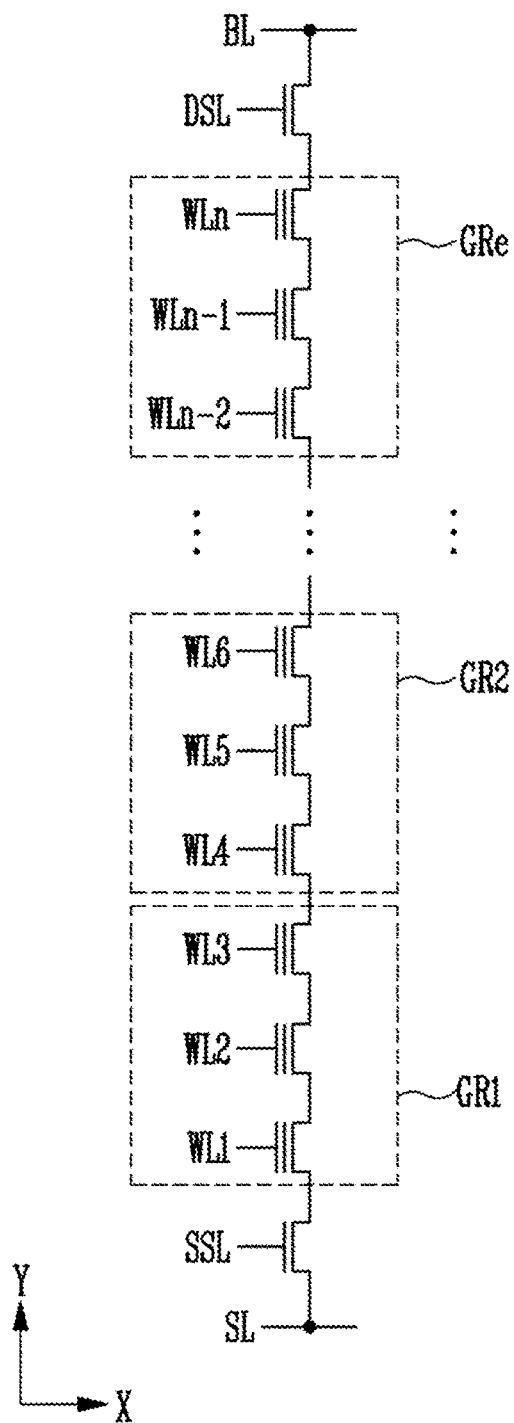
FIGS. 11 to 13 are diagrams that aid in explaining word line groups in an embodiment in accordance with the present invention.
Figure 12:
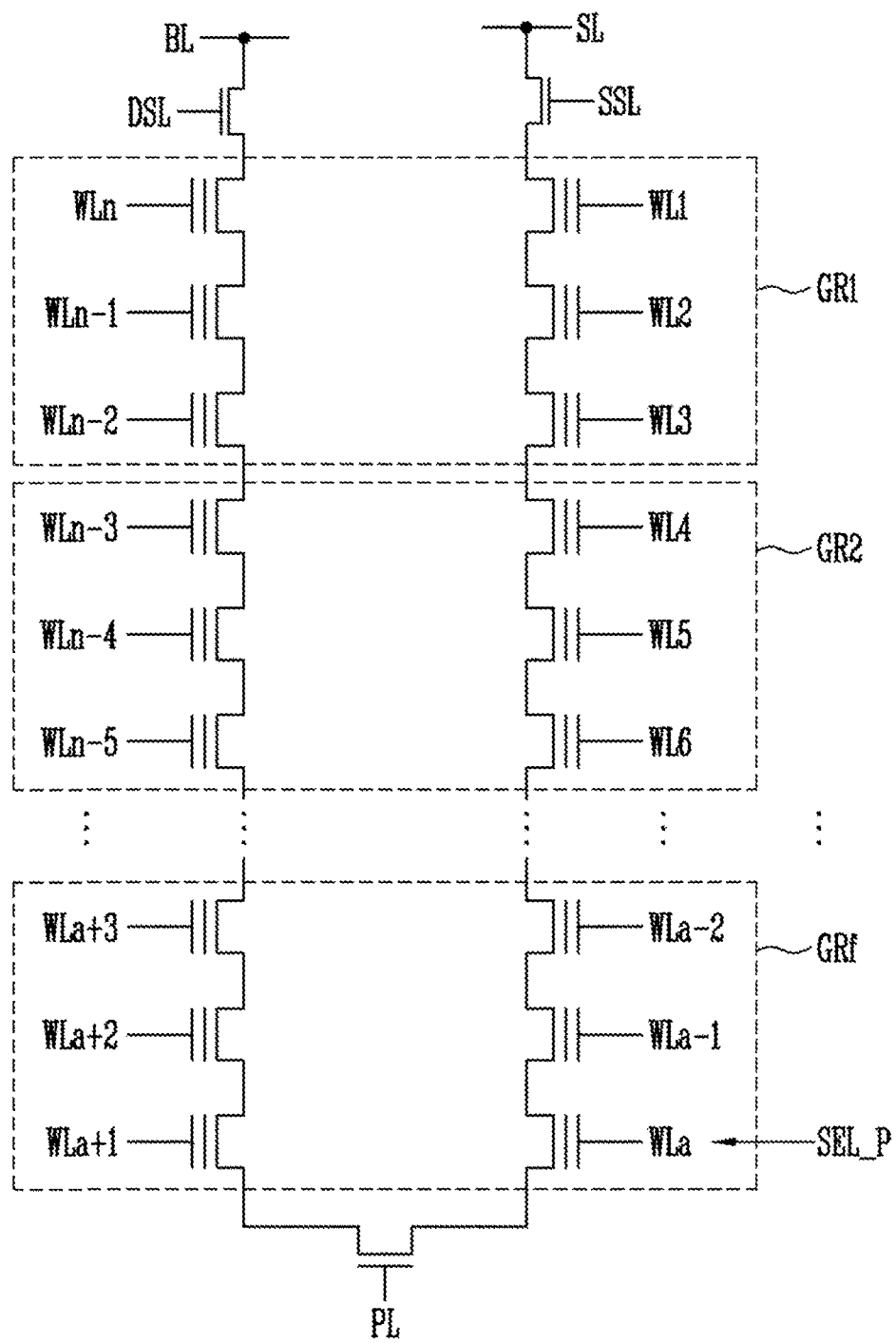
Figure 13:
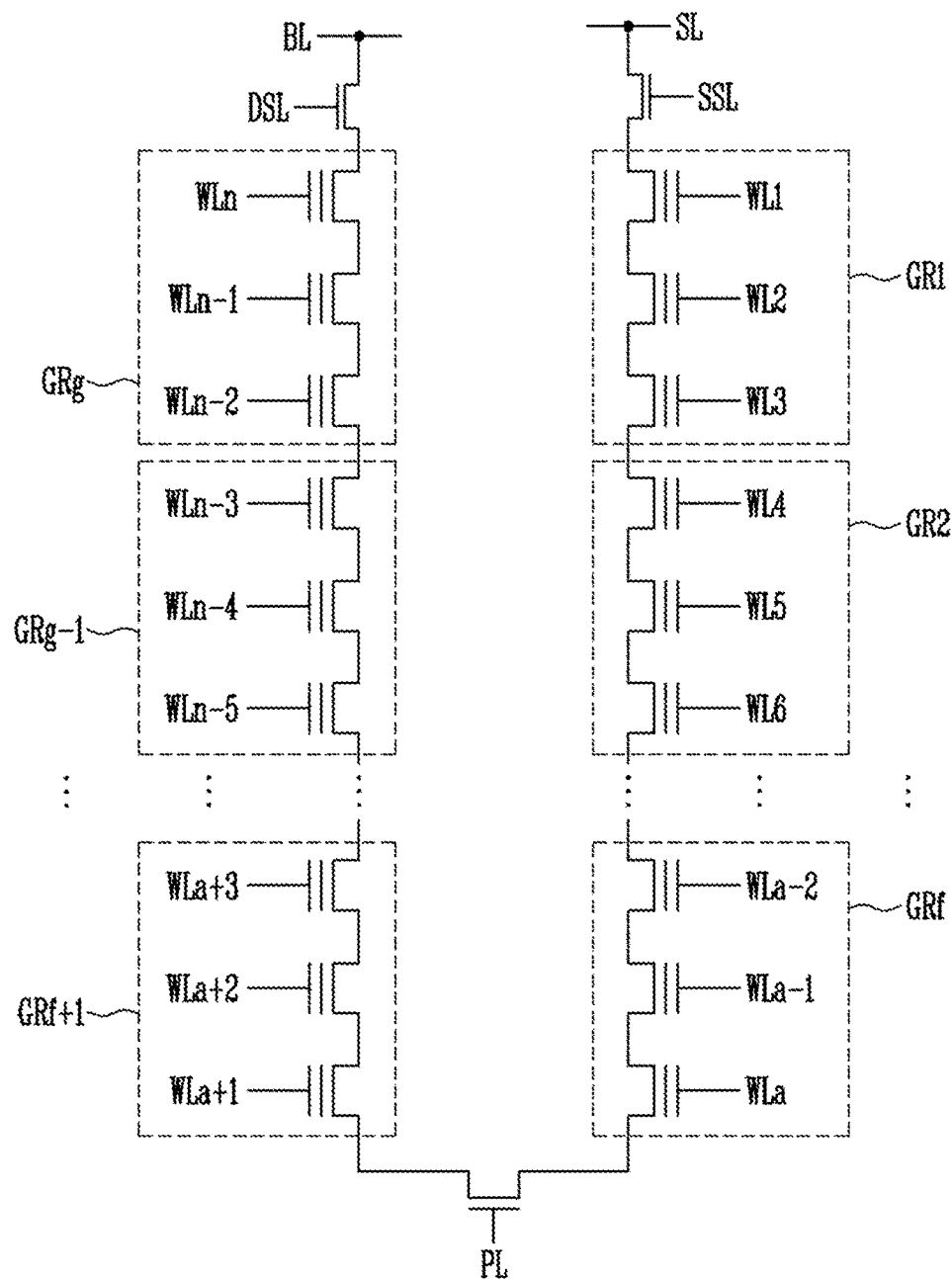

FIGS. 11 to 13 are diagrams for explaining word line groups in an embodiment in accordance with the present invention.

Referring to FIG. 11, memory cells may be formed in a 3D structure in which they are stacked on a substrate in a vertical direction (a Y direction) and may form an I-shaped string. For example, a source select line SSL, first to n-th word lines WL1 to WLn, a drain select line DSL, and a bit line BL may be sequentially stacked on a source line SL. The source select line SSL may be coupled to the gates of source select transistors included in different strings. The first to n-th word lines WL1 to WLn may be coupled to the gates of memory cells included in different strings. The drain select line DSL may be coupled to the gates of drain select transistors included in different strings.

The first to n-th word lines WL1 to WLn may be divided into a plurality of groups GR1 to GRe (where e is a positive integer). For example, three word lines may be set to a single group. In an embodiment, the first to third word lines WL1 to WL3 may be included in the first group GR1, the fourth to sixth word lines WL4 to WL6 may be included in the second group GR2, and the n−2-th to n-th word lines WLn−2 to WLn may be included in the e-th group GRe in this way. The numbers of word lines included in respective groups may be identical to or different from each other.

Referring to FIG. 12, memory cells may be formed in a 3D structure in which they are stacked on a substrate in a vertical direction (a Y direction), and may form a U-shaped string.

For example, a-th to first word lines WLa to WL1 (where a is a positive integer), a source select line SSL, and a source line SL may be sequentially stacked on the top of one end of a pipeline PL, and a+1-th to n-th word lines WLa+1 to WLn, a drain select line DSL, and a bit line BL may be sequentially stacked on the top of the other end of the pipeline PL. The source select line SSL may be coupled to the gates of source select transistors included in different strings. The first to n-th word lines WL1 to WLn may be coupled to the gates of memory cells included in different strings. The drain select line DSL may be coupled to the gates of drain select transistors included in different strings. The a-th to first word lines WLa to WL1 and the a+1-th to n-th word lines WLa+1 to WLn may sequentially make pairs, and paired word lines may be respectively formed in the same plane. For example, the a-th and a+1-th word lines WLa and WLa+1 may be formed in the sample plane, and the a−1-th and a+2-th word lines WLa−1 and WLa+2 may be formed in the same plane over the a-th and a+1-th word lines WLa and WLa+1. That is, the a-th to first word lines WLa to WL1 may be formed on the side of the source select line SSL, and the a+1-th to n-th word lines WLa+1 to WLn may be formed on the side of the drain select line DSL, with respect to the pipeline PL.

The first to n-th word lines WL1 to WLn may be divided into a plurality of groups GR1 to GRf (where f is a positive integer). For example, the first to n-th word lines WL1 to WLn may be divided into groups including some word lines formed on the side of the source select line SSL and groups including some word lines formed on the side of the drain select line DSL. In an embodiment, the first to third word lines WL1 to WL3 and the n-th to n−2-th word lines WLn to WLn−2 may be included in the first group GR1, and the fourth to sixth word lines WL4 to WL6 and the n−3-th to n−5-th word lines WLn−3 to WLn−5 may be included in the second group GR2. In this way, the a−2-th to a-th word lines WLa-2 to WLa and the a+3-th to a+1-th word lines WLa+3 to WLa+1 may be included in the f-th group GRf. The numbers of word lines included in respective groups may be identical to or different from each other.

Referring to FIG. 13, memory cells may be formed and coupled in the same structure as FIG. 12. However, in FIG. 13, the first to a-th word lines WL1 to WLa formed on the side of the source select line SSL and the n-th to a+1-th word lines WLn to WLa+1 formed on the side of the drain select line DSL may be included in different groups. For example, the first to third word lines WL1 to WL3 may be included in a first group GR1, and the fourth to sixth word lines WL4 to WL6 may be included in a second group GR2. The a−2-th to a-th word lines WLa-2 to WLa may be included in an f-th group (where f is a positive integer). The a+1-th to a+3-th word lines WLa+1 to WLa+3 may be included in an f+1-th group GRf+1, and the n−5-th to n−3-th word lines WLn−5 to WLn−3 may be included in a g−1-th group GRg−1, and the n−2-th to n-th word lines WLn−2 to WLn may be included in a g-th group GRg.

Since the above-described FIGS. 11 to 13 aid in understanding embodiments in accordance with the present invention, the numbers of word lines included in respective groups and the number of groups may be changed depending on the memory device.

FIGS. 14 to 17 are diagrams for explaining examples of a program operation for word line groups described with reference to FIGS. 11 to 13.

A program operation of a memory device in which groups GP1 to GRe, each including word lines, are arranged in an 'I'-shape, as illustrated in FIG. 11 or 12, will be described below with reference to FIG. 14.

The first to e-th groups GR1 to GRe may be programmed based on different program operation codes, but a plurality of groups may also be programmed based on the same program operation code. FIG. illustrates an embodiment in which a plurality of groups are programmed based on the same program operation code, and, in detail, an embodiment in which the same program operation code is applied to every two groups will be described below.

For example, in the first and second groups GR1 and GR2, a first program operation may be performed based on a first program operation code 1PGM_1BLD. In the third and fourth groups GR3 and GR4, a second program operation may be performed based on a second program operation code 2PGM_2BLD. In this way, in the e−1-th and e-th groups GRe−1 and GRe, a k-th program operation may be performed based on a k-th program operation code kPGM-_kBLD. That is, a program operation code may be selected depending on the group in which the selected word line is included, and a program operation may be performed on memory cells coupled to the selected word line based on the selected program operation code.

As an example, a program operation in which the selected word line is included in the first group GR1 will be described below.

In response to an address (ADD of FIG. 2) received by the memory device (e.g., 1100 of FIG. 2), if it is determined that the selected word line is included in the first group GR1, the control logic (e.g., 160 of FIG. 2) may select a first program algorithm 1PGM set for the first group GR1. In this case, the first operation information 1BLD corresponding to the first program algorithm 1PGM may be automatically selected. Further, if it is determined that the selected word line is included in the second group GR2, the control logic (e.g., 160 of FIG. 2) may select the first program algorithm 1PGM set for the second group GR2. Even in this case, the first operation information 1BLD corresponding to the first program algorithm 1PGM may be automatically selected. Therefore, when the selected word line is included in the first or second group GR1 or GR2, the first program operation corresponding to the first program algorithm 1PGM and the first operation information 1BLD may be performed on memory cells included in the selected page. For example, the first program operation may be performed using an ISPP method that uses a first step voltage based on the first program algorithm, and blind periods may be applied to the first program operation depending on the second operation information.

In this way, when the selected word line is included in the e−1-th or e-th group GRe−1 or GRe, the control logic (e.g., 160 of FIG. 2) may select the k-th program algorithm kPGM set for the e−1-th and e-th groups GRe−1 and GRe. Here, the k-th operation information kBLD corresponding to the k-th program algorithm kPGM may be automatically selected. Therefore, when the selected word line is included in the e−1-th or e-th group GRe−1 or GRe, a k-th program operation corresponding to the k-th program algorithm kPGM and the k-th operation information kBLD may be performed on memory cells included in the selected page. For example, the k-th program operation may be performed using an ISPP method that uses a k-th step voltage based on the k-th program algorithm, and blind periods may be applied to the k-th program operation depending on the k-th operation information.

Figure 14:
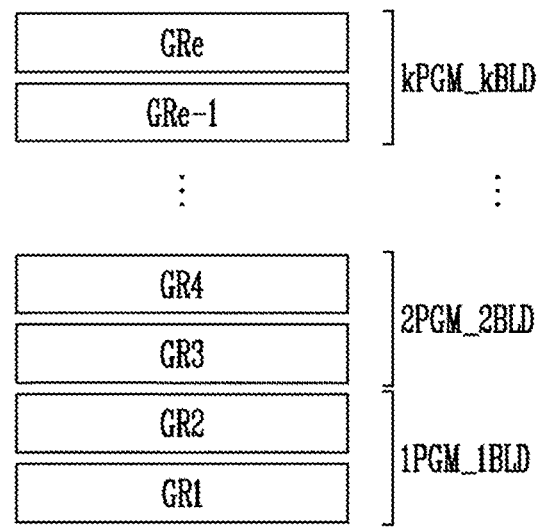
FIGS. 14 to 17 are diagrams that aid in explaining program operation for the word line groups described with reference to FIGS. 11 to 13.

Although the same program operation is illustrated as being performed every two groups in FIG. 14, this example is intended to help the understanding of the present embodiment, and thus program operations may be performed on respective groups using various methods other than the method applied to FIG. 14.

A program operation of a memory device in which groups GR1 to GRe, each including word lines, are arranged in a 'U'-shape, as illustrated in FIG. 13, will be described below with reference to FIG. 15.

The first to e-th groups GR1 to GRe may be respectively programmed based on different program operation codes, but a plurality of groups may also be programmed based on the same program operation code. FIG. 15 illustrates an example in which a plurality of groups are programmed based on the same program operation code, and, in detail, a program operation in which the same program operation code is applied to every three groups will be described.

Assuming that the first group GR1 and the g-th group GRg are located in the same plane, the electrical characteristics of memory cells included in the first group GR1 and in the g-th group GRg may be similar to each other. For example, in the case of a memory device having a 3D structure, there may be a difference between the widths of an upper portion and a lower portion of a channel through which the memory cells are coupled to each other, due to the characteristics of a manufacturing process. For example, the width of the channel may be narrowed in a direction from the upper portion to the lower portion of the channel. Therefore, there may be the difference between the electrical characteristics of the memory cells located in the upper portion and the memory cells located in the lower portion. On the other hand, since the channel widths of the memory cells in the same plane are similar to each other, there may be a relatively small difference between the electrical characteristics of the memory cells located in the same plane.

Therefore, the program operations of pages included in the groups located in similar planes may be adjusted within a range in which a large difference does not occur. For example, assuming that a first program operation is performed, based on the first program operation code 1PGM_1BLD, on pages included in f-th to f-2-th groups GRf to GRf-2 which are located in a relatively low portion in a string, a second program operation may be performed, based on the second program operation code 2PGM_2BLD, on pages included in f+1-th to f+3-th groups GRf+1 to GRf+3 formed at locations similar to those of the f-th to f-2-th groups GRf to GRf-2. Here, the second program operation may not have a great difference from the first program operation. In this way, the third program operation may be performed on pages in f-3-th to f-5-th groups GRf-3 to GRf-5, and the fourth program operation may be performed on pages in f+4-th to f+6-th groups GRf+4 to GRf+6. Here, differences between the step voltages and blind periods of the first and second program operations may be smaller than differences between the step voltages and blind periods of the first and third program operations.

Figure 15:
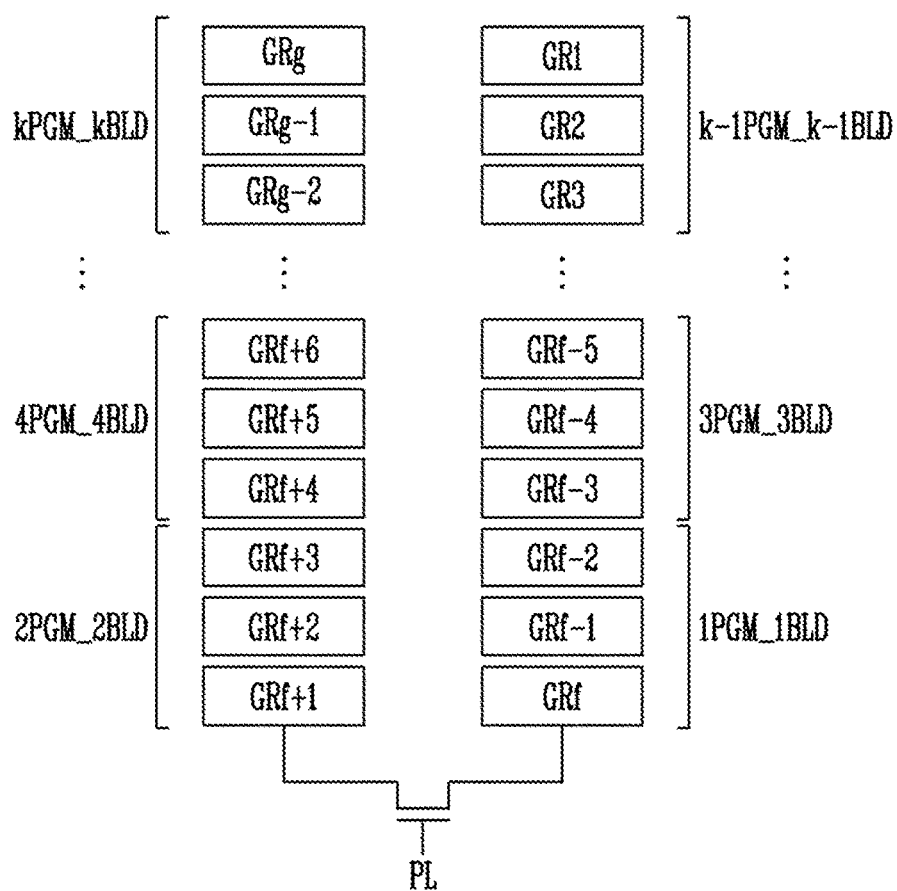

Although the same program operation is illustrated as being performed every three groups in FIG. 15, this example is intended to help the understanding of the present embodiment, and program operations may be performed on respective groups using various methods other than the method applied to FIG. 15.

Figure 16:
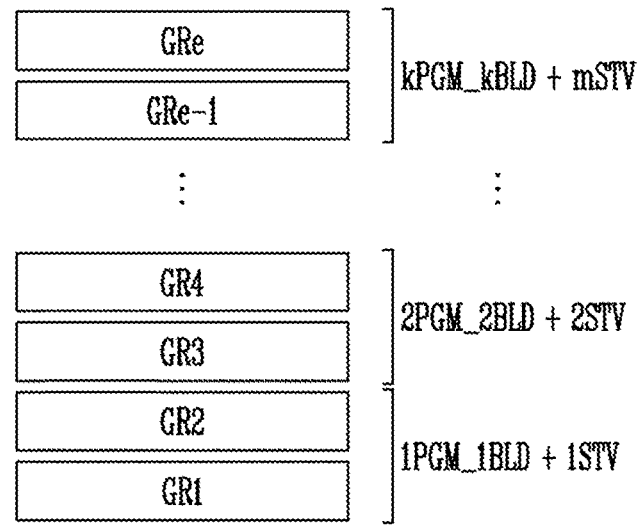

Referring to FIG. 16, program operations having different step voltages and blind periods may be performed using a method similar to the embodiment described above with reference to FIG. 14, but differences between start program voltages 1STV to mSTV may be added to the program operations. For example, in a group in which the threshold voltages of memory cells are increased more slowly than those of other groups, the start program voltage of the group may be set to a higher voltage.

Figure 17:
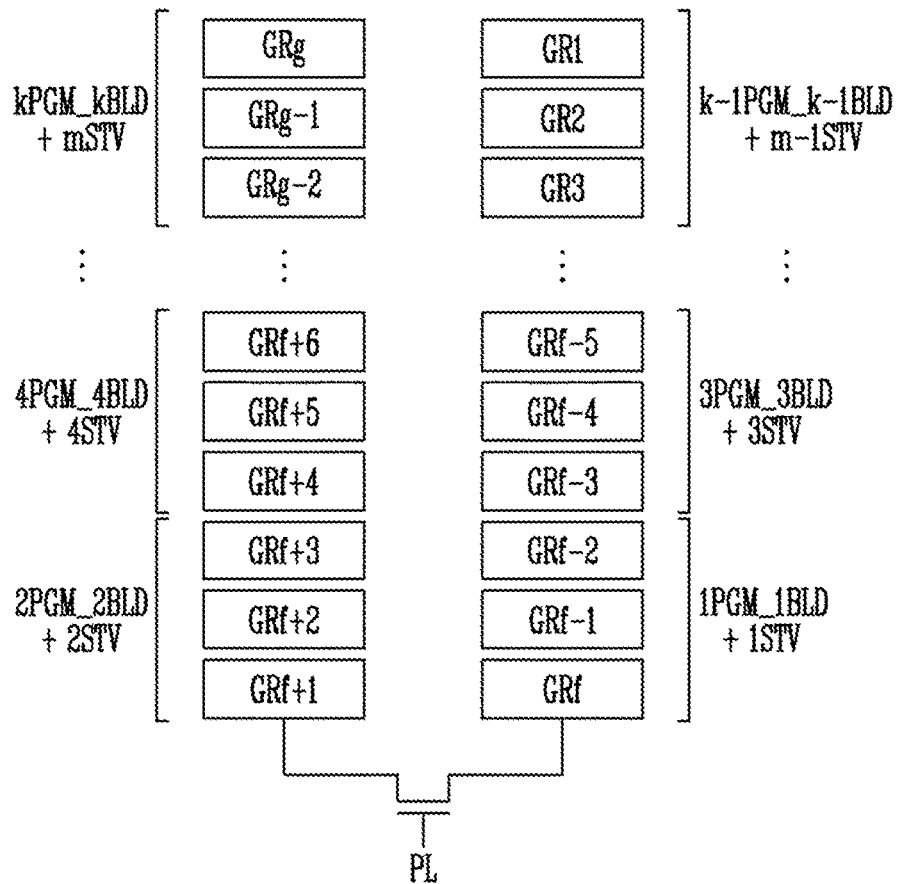

Referring to FIG. 17, program operations having different step voltages and blind periods may be performed using a method similar to the embodiment described above with reference to FIG. 15, but differences between the start program voltages 1STV to mSTV may be added to the program operations. For example, in a group in which the threshold voltages of memory cells are increased more slowly than those of other groups, the start program voltage of the group may be set to a higher voltage.

Although program operations in which start program voltages, step voltages, and blind periods are respectively different from each other based on different program operation codes have been described in the foregoing embodiments, various program operation conditions may be included in addition to the above conditions.

Figure 18:
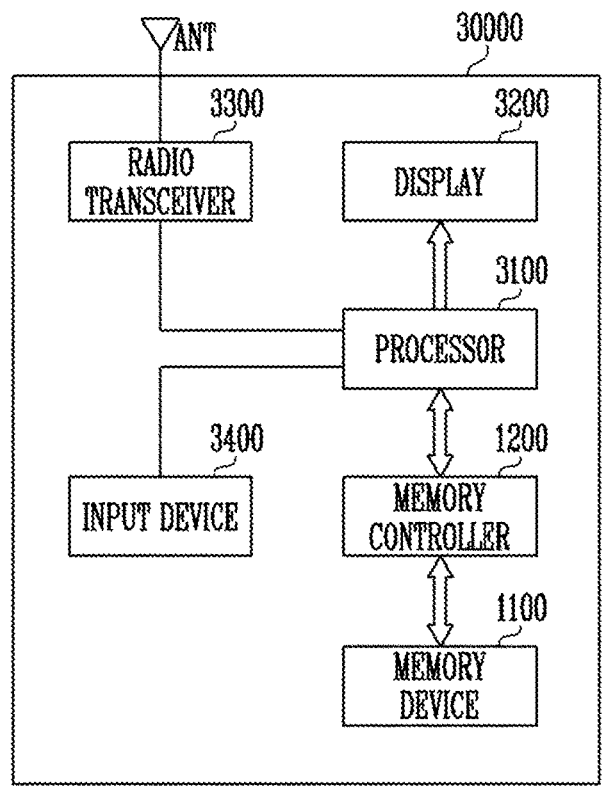
FIG. 18 is a diagram illustrating an embodiment of a memory system, such as a memory system that may be found in a cell phone, including the memory device illustrated in FIG. 2.

FIG. 18 is a diagram illustrating an embodiment of a memory system including the memory device illustrated in FIG. 2.

Referring to FIG. 18, a memory system 30000 may be embodied in a cellular phone, a smartphone, a tablet PC, a personal digital assistant (PDA) or a wireless communication device. The memory system 30000 may include the memory device 1100 and a memory controller 1200 capable of controlling the operation of the memory device 1100. The memory controller 1200 may control a data access operation, e.g., a program, erase, or read operation, of the memory device 1100 under the control of a processor 3100.

Data programmed in the memory device 1100 may be output through a display 3200 under the control of the memory controller 1200.

A radio transceiver 3300 may send and receive radio signals through an antenna ANT. For example, the radio transceiver 3300 may change a radio signal received through the antenna ANT into a signal which may be processed in the processor 3100. Therefore, the processor 3100 may process a signal output from the radio transceiver 3300 and transmit the processed signal to the memory controller 1200 or the display 3200. The memory controller 1200 may program a signal processed by the processor 3100 to the memory device 1100. Furthermore, the radio transceiver 3300 may change a signal output from the processor 3100 into a radio signal, and output the changed radio signal to the external device through the antenna ANT. An input device 3400 may be used to input a control signal for controlling the operation of the processor 3100 or data to be processed by the processor 3100. The input device 3400 may be implemented as a pointing device such as a touch pad or a computer mouse, a keypad or a keyboard. The processor 3100 may control the operation of the display 3200 such that data output from the memory controller 1200, data output from the radio transceiver 3300, or data output from the input device 3400 is output through the display 3200.

In an embodiment, the memory controller 1200 capable of controlling the operation of the memory device 1100 may be implemented as a part of the processor 3100 or a chip provided separately from the processor 3100.

Figure 19:
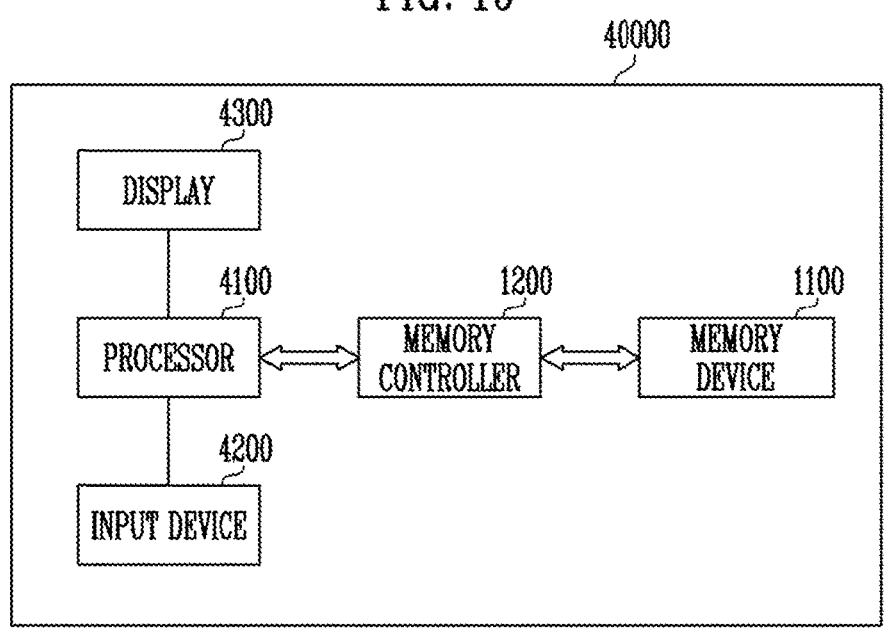
FIG. 19 is a diagram illustrating an embodiment of a memory system, such as a memory system that may be found in a personal computer, including the memory device illustrated in FIG. 2.

FIG. 19 is a diagram illustrating an embodiment of a memory system including the memory device illustrated in FIG. 2.

Referring to FIG. 19, a memory system 40000 may be embodied in a personal computer, a tablet PC, a net-book, an e-reader, a personal digital assistant (PDA), a portable multimedia player (PMP), an MP3 player, or an MP4 player.

The memory system 40000 may include the memory device 1100 and a memory controller 1200 capable of controlling the data processing operation of the memory device 1100.

A processor 4100 may output data stored in the memory device 1100 through a display 4300, according to data input from an input device 4200. For example, the input device 4200 may be implemented as a point device such as a touch pad or a computer mouse, a keypad or a keyboard.

The processor 4100 may control the overall operation of the memory system 40000 and control the operation of the memory controller 1200. In an embodiment, the memory controller 1200 capable of controlling the operation of the memory device 1100 may be implemented as a part of the processor 4100 or a chip provided separately from the processor 4100.

Figure 20:
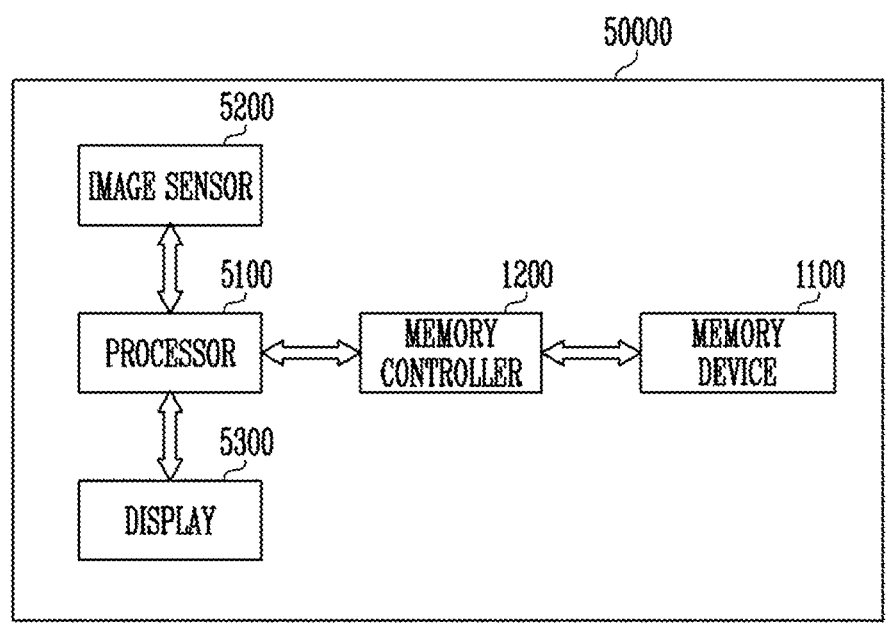
FIG. 20 is a diagram illustrating an embodiment of a memory system, such as a memory system that may be found in a digital camera, including the memory device illustrated in FIG. 2.

FIG. 20 is a diagram illustrating an embodiment of a memory system including the memory device illustrated in FIG. 2.

Referring to FIG. 20, a memory system 50000 may be embodied in an image processing device, e.g., a digital camera, a portable phone provided with a digital camera, a smartphone provided with a digital camera, or a tablet PC provided with a digital camera.

The memory system 50000 may include the memory device 1100 and a memory controller 1200 capable of controlling a data processing operation, e.g., a program, erase, or read operation, of the memory device 1100.

An image sensor 5200 of the memory system 50000 may convert an optical image into digital signals. The converted digital signals may be transmitted to a processor 5100 or the memory controller 1200. Under the control of the processor 5100, the converted digital signals may be output through a display 5300 or stored in the memory device 1100 through the memory controller 1200. Data stored in the memory device 1100 may be output through the display 5300 under the control of the processor 5100 or the memory controller 1200.

In an embodiment, the memory controller 1200 capable of controlling the operation of the memory device 1100 may be implemented as a part of the processor 5100, or a chip provided separately from the processor 5100.

Figure 21:
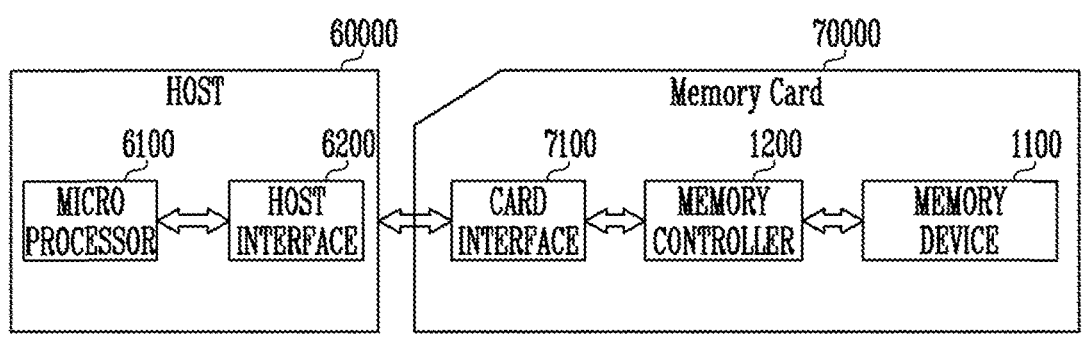
FIG. 21 is a diagram illustrating an embodiment of a memory system, such as a memory system that may be found in a memory card or smart card, including the memory device illustrated in FIG. 2.

FIG. 21 is a diagram illustrating an embodiment of a memory system including the memory device illustrated in FIG. 2.

Referring to FIG. 21, a memory system 70000 may be embodied in a memory card or a smart card. The memory system 70000 may include the memory device 1100, a memory controller 1200 and a card interface 7100.

The memory controller 1200 may control data exchange between the memory device 1100 and the card interface 7100. In an embodiment, the card interface 7100 may be a secure digital (SD) card interface or a multi-media card (MMC) interface, but it is not limited thereto.

The card interface 7100 may interface data exchange between a host 60000 and the memory controller 1200 according to a protocol of the host 60000. In an embodiment, the card interface 7100 may support a universal serial bus (USB) protocol, and an inter-chip (IC)-USB protocol. Here, the card interface may refer to hardware capable of supporting a protocol which is used by the host 60000, software installed in the hardware, or a signal transmission method.

When the memory system 70000 is connected to a host interface 6200 of the host 60000 such as a PC, a tablet PC, a digital camera, a digital audio player, a cellular phone, console video game hardware or a digital set-top box, the host interface 6200 may perform data communication with the memory device 1100 through the card interface 7100 and the memory controller 1200 under the control of a microprocessor 6100.

The implementation described herein may prevent the excessive use of registers by reducing the amount of data required for program operations.

While certain embodiments have been described above, it will be understood by those skilled in the art that the embodiments described are by way of example only. Accordingly, the memory devices and methods of operating described herein should not be limited based on the described embodiments. Rather, the memory devices and methods of operating described herein should only be limited in light of the claims that follow, when taken in conjunction with the above description and accompanying drawings.

What is claimed is:

1. A memory device, comprising:
a memory block including a plurality of pages; and
a control logic configured to include a register in which a plurality of program algorithms and a plurality of pieces of operation information are stored, to select one of the plurality of program algorithms in response to an address of a program target page, among the plurality of pages, and to perform a program operation to increase threshold voltages of memory cells included in the program target page to a target program state among a plurality of program states, based on a selected program algorithm among the plurality of program algorithms and a piece of operation information corresponding to the selected program algorithm,
wherein the program operation includes a plurality of program loops, and each program loop includes a verify operation,
wherein the plurality of program algorithms comprise algorithms based on an incremental step pulse program (ISPP) method that increases a program voltage by a step voltage as a number of program loops increases,
wherein the plurality of program algorithms include different step voltages according to addresses of the plurality of pages,
wherein the piece of operation information includes loop information in which verify operations corresponding to the plurality of program states, respectively, are started, according to the different step voltages,
wherein the loop information is determined based on the number of program loops or a number of applications of program voltages.

2. The memory device according to claim 1, wherein the register is configured to store:
codes for the plurality of program algorithms, and
codes for the plurality of pieces of operation information.

3. The memory device according to claim 2, wherein:
the codes for the plurality of pieces of operation information correspond to the codes for the plurality of program algorithms.

4. The memory device according to claim 1, wherein each of the program loops comprises:
a sub-program operation configured to apply a program voltage to a selected word line coupled to the program target page, and
verify operations configured to determine whether threshold voltages of memory cells coupled to the selected word line have reached target voltages.

5. The memory device according to claim 4, wherein the control logic is configured to cause a part of the verify operations to be omitted in a part of periods depending on the piece of operation information.

6. The memory device according to claim 5, wherein the register is configured such that the piece of operation information includes codes for the periods in which the verify operations are omitted.

7. The memory device according to claim 1, wherein the plurality of pages are divided into a plurality of groups.

8. The memory device according to claim 7, wherein the plurality of pages are configured such that pages included in at least one of the groups are programmed based on an identical program algorithm.

9. The memory device according to claim 8, wherein the control logic is configured to:
   determine the selected program algorithm according to groups including the program target page from among the plurality of program algorithms, and
   perform a program operation on the program target page based on the selected program algorithm.

10. The memory device according to claim 1, further comprising peripheral circuits configured to program memory cells included in the program target page under control of the control logic.

11. A method of operating a memory device, comprising:
   selecting a program algorithm among a plurality of program algorithms stored in a register and a piece of operation information corresponding to the program algorithm among a plurality of pieces of operation information stored in the register in response to an address of a program target page, among a plurality of pages; and
   performing a program operation to increase threshold voltages of memory cells included in the program target page based on the program algorithm and the piece of operation information,
   wherein the program operation includes a plurality of program loops, and each program loop includes a verify operation,
   wherein the plurality of program algorithms have different voltage conditions, wherein the plurality of pieces of operation information correspond to the plurality of program algorithms, respectively,
   wherein the piece of operation information includes loop information in which verify operations corresponding to the plurality of program states, respectively, are started, according to the different voltage conditions, and
   wherein the loop information is determined based on the number of program loops or a number of applications of program voltages.

12. The method according to claim 11, wherein the program operation is performed based on an incremental step pulse program (ISPP) method that increases a program voltage by a step voltage whenever each of program loops is executed.

13. The method according to claim 12, wherein the plurality of program algorithms are configured such that the step voltage is set to different voltages.

14. The method according to claim 12, wherein each of the program loops comprises:
   a sub-program operation configured to apply a program voltage to a selected word line coupled to the program target page, and
   verify operations configured to determine whether threshold voltages of memory cells coupled to the selected word line have reached target voltages.

15. The method according to claim 14, wherein the piece of operation information includes codes for periods in which the verify operations are omitted.

16. The method according to claim 11, further comprising, before the selecting, dividing word lines coupled to the plurality of pages into a plurality of groups.

17. The method according to claim 16, further comprising allowing the program algorithm to correspond to the groups.

18. The method according to claim 17, wherein the program algorithm and the piece of operation information correspond to a group including the program target page.

* * * * *